United States Patent [19]

Arumugham et al.

[11] 4,122,493
[45] Oct. 24, 1978

[54] ADAPTIVE WIDEBAND AFC SYSTEM

[75] Inventors: Rangaswamy Arumugham, Batavia; George Hager Kam, Tonawanda, both of N.Y.

[73] Assignee: GTE Sylvania Incorporated, Stamford, Conn.

[21] Appl. No.: 833,759

[22] Filed: Sep. 16, 1977

[51] Int. Cl.² .......................... H04N 5/50; H04B 1/16
[52] U.S. Cl. ..................................... 358/195; 325/422; 334/16; 325/459
[58] Field of Search ................. 358/195; 325/418–420, 325/422, 423, 459, 464, 465; 334/15, 16; 331/177 V

[56] References Cited

U.S. PATENT DOCUMENTS

| | | | |
|---|---|---|---|
| 3,825,858 | 7/1974 | Amemiya et al. | 331/177 V |
| 3,959,728 | 5/1976 | Yamazaki et al. | 358/195 |
| 4,005,256 | 1/1977 | Arumugham | 358/195 |

Primary Examiner—John C. Martin
Attorney, Agent, or Firm—John A. Odozynski

[57] ABSTRACT

Circuitry compensating for inherent nonlinearities in the tuning voltage sensitivity of varactor tuners, thereby providing relatively constant AFC pull-in range throughout the band of operating frequencies, is shown. In both the VHF and UHF bands, the AFC system develops an error correction voltage in proportion to the tuning voltage. With respect to reception of VHF channels, a gain switching circuit operates to reduce the proportion of AFC error correction voltage developed on a High Band VHF channel, thereby compensating for increased tuning voltage sensitivity on High Band VHF. With respect to reception of UHF channels, a tuning voltage sensing circuit operates to effect an error correction voltage that is a greater proportion of the tuning voltage when the tuning voltage is above a pre-determined value corresponding to approximately channel 60.

16 Claims, 5 Drawing Figures

ADAPTIVE WIDEBAND AFC SYSTEM

FIELD OF THE INVENTION

This invention relates to wideband automatic frequency control systems and more particularly to circuitry for providing relatively constant AFC pull-in range in spite of the nonlinear variations in tuning voltage sensitivity as a function of the operating frequency of the frequency tuning element.

BACKGROUND OF THE INVENTION

Automatic frequency control (AFC) has become an important, if not essential, feature of television receivers. Conventional AFC circuits are intended to detect and correct errors in the converted frequency of the desired channel picture carrier. AFC circuits typically contain a frequency discriminating circuit that provides an output voltage related to the difference between the input signal frequency, converted to the intermediate frequency (IF), and the nominal IF picture carrier frequency, 45.75 MHz. This voltage is then applied to a voltage-sensitive reactive element in the tuner's local oscillator circuit so as to reduce the detected frequency error. Tuners utilizing varactor diodes as the frequency determining reactive elements are especially well-adapted for operation with AFC circuitry. The error correction output voltage of the AFC circuit can be readily combined with varactor tuning voltage to compensate for existing frequency errors.

Obviously one goal of an AFC system is to reduce frequency errors of the magnitude likely to occur in the operation of a television receiver and, furthermore, to provide correction so that the local oscillator frequency is sufficiently close to the correct frequency that any remaining errors in the converted IF picture carrier frequency are substantially inconsequential. In general, the AFC system is capable of providing error correction commensurate with the magnitude of error correction voltage it develops. The greater the range of error correction voltage, the greater the pull-in range. By developing an adequate amount of error correction voltage, a properly operating AFC system should be able to reduce frequency errors of $\pm 1.5$ MHz to less than $\pm 100$ KHz.

There is, however, a limit to the range of error correction voltage that may be safely developed. If an excessive error correction voltage is developed, the AFC system may be capable of locking on to signals other than the desired channel picture carrier. For example, if there is suffficient error correction voltage, the desired channel sound carrier, nominally at 41.25 MHz, and the lower adjacent channel sound carrier, nominally at 47.25 MHz, may be detected by the AFC discriminator and converted to a frequency near 45.75 MHz so as to result in a false lock-in condition. Limiting the maximum range of correction voltage reduces the possibility of such effects. The ideal range of correction voltage represents a compromise between the desire to provide as much correction as possible and the need to avoid false locking phenomena.

Striking this compromise in AFC systems with varactor tuners is particularly difficult. Because of nonlinearities in the voltage-frequency characteristic of varactor tuners, an error correction range appropriate for one channel may provide inadequate correction, or, alternatively, false locking on another. AFC circuits that develop a range of error correction voltage in proportion to the nominal tuning voltage provide a degree of compensation for these effects. It has been found, however, that alternative or improved methods of compensation are necessary and possible.

OBJECTS OF THE INVENTION

It is an object of this invention to provide substantially constant AFC pull-in range on all channels of a television receiver.

It is a further object of this invention to provide the range of AFC error correction voltage that is a proportion of the tuning voltage.

It is a further object of this invention to vary the above proportion in response to operation on channels within the distinct bands of the television receiver.

It is a further object of this invention to vary the above proportion in response to tuning voltages above or below a predetermined value.

SUMMARY OF THE INVENTION

In one aspect of this invention the above and further objects and advantages are achieved in an adaptive wideband AFC system for voltage-tuned UHF and VHF tuners in a television receiver. A gain switch means varies the range of AFC error correction voltage developed by the AFC system and applied to the tuners' tuning control terminals. The gain switch is responsive to a signal indicative of operation on a channel included in a predetermined band of channels.

In another aspect of this invention, the adaptive wideband AFC system comprises a tuning voltage sensing circuit for effecting an error correction voltage that is a first proportion of tuning voltages below a predetermined value and a second proportion of tuning voltage above the predetermined value.

DESCRIPTION OF THE PREFERRED EMBODIMENTS

Figure 1:
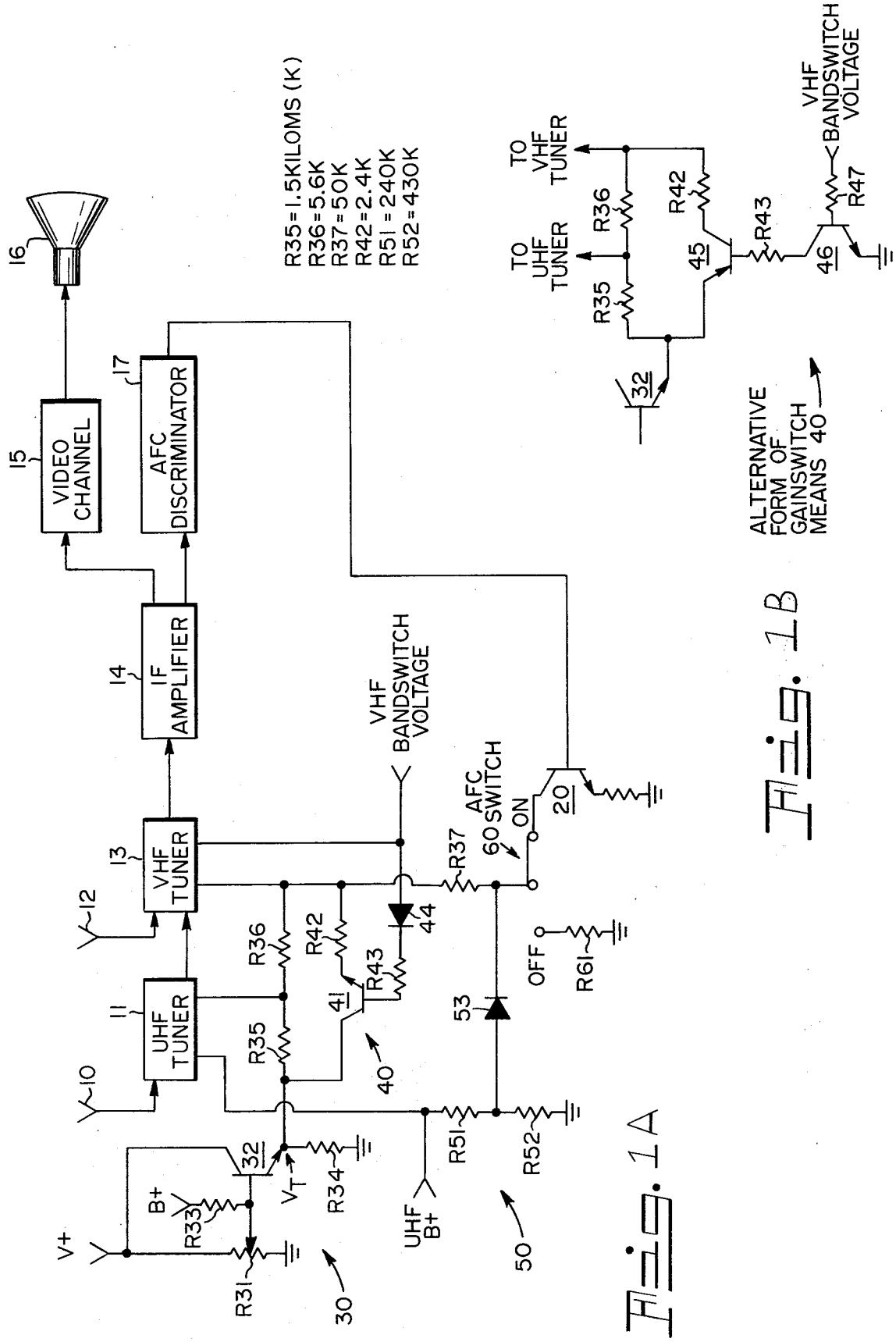
FIGS. 1A and 1B are schematic diagrams of the subject invention. Conventional cooperating elements are shown in block form.

For a better understanding of the present invention, together with other and further objects, advantages and capabilities thereof, reference is made to the following disclosure and appended claims in connection with the above-described drawings.

As illustrated in FIG. 1A, an antenna 10 couples a modulated radio frequency (RF) carrier signal in the ultra-high frequency (UHF) range to a UHF tuner 11 which may include an RF amplifier, mixer, and local oscillator. Similarly, an antenna 12 couples an RF carrier signal in the very-high frequency (VHF) range to a VHF tuner 13 which also may include an RF amplifier, mixer and local oscillator. The respective tuners convert RF picture carrier signals to an intermediate frequency (IF) of typically 45.75 MHz. Frequency conversion is conventionally accomplished by heterodyning the received RF carrier signal with a local oscillator signal having a frequency 45.75 MHz above the nominal RF carrier signal frequency. Although it is conventional for the VHF tuner to be disabled during operation on a UHF channel, in many television receivers the VHF tuner mixer is enabled in order to enhance the sensitivity of the receiver in the UHF mode. The 45.75 MHz output of the UHF tuner can then be coupled through the VHF mixer, which operates as an IF post amplifier when the UHF tuner is energized. This signal is then coupled to the input of an IF amplifier 14. The output of the IF amplifier is demodulated and further processed in a video channel 15 and coupled to a cathode ray tube 16. At least a portion of the output of the IF amplifier is also coupled to an AFC discriminator 17. The discriminator can be one of many known types, such as the discriminator and associated circuitry described in Siwko, "Wide Band AFC System", U.S. Pat. No. 3,952,143. The discriminator is tuned to the nominal IF frequency, 45.75 MHz. It provides an output signal of a given polarity, say negative, for input signals below the nominal IF frequency, and an opposite polarity, say positive, for input signals above the nominal IF frequency. In addition the discriminator may contain, as in Siwko, a DC bias voltage of approximately 0.5 volts to an error amplifer in the form of a transistor 20. Discriminator outputs of a negative polarity, corresponding to input signals below 45.75 MHz, tend to drive transistor 20 into cutoff; outputs of a positive polarity, corresponding to input signals above 45.75 MHz, tend to drive transistor 20 into saturation.

The respective tuning voltage for both the UHF and VHF tuner is provided by a source of tuning voltage 30 comprising a variable resistor R31, connected between a voltage source V+ and circuit ground, and a transistor 32. Transistor 32 has a base electrode connected to the wiper of variable resistor 31, a collector electrode connected to V+, and an emitter electrode connected through a resistor R34 to circuit ground. A bias supply B+ and resistor R33 provide bias current to transistor 32. The position of the wiper resistor 31 establishes the tuning voltage $V_T$, that appears at the emitter of transistor 32. Tuning voltage, $V_T$, determines the operating frequency of both the UHF and VHF tuners and is normally adjusted so that the desired channel picture carrier is converted to 45.75 MHz. Although only one variable resistor is shown, it is conventional to provide a variable resistor for each VHF channel and for an appropriate number of UHF channels. The wipers of these resistors are then switched, either mechanically or electronically, to the base of transistor 32 according to the particular channel selected.

$V_T$ is applied through a first resistor R35 to the tuning control terminal of the UHF tuner and through a series-connected second resistor, R36, to the tuning control terminal of the VHF tuner. R36 is connected through a third resistor R37 to the common terminal of an AFC switch 60. In the AFC ON mode R37 is connected to the AFC error amplifier, transistor 20. In the AFC OFF mode resistor 37 is connected through resistor R61 to circuit ground. A normal set-up procedure for a given channel is to place the AFC switch in the OFF position and adjust R31 for correct tuning. This establishes a nominal tuning voltage at the respective UHF or VHF tuning control terminal. Correct fine tuning is maintained by placing the AFC switch in the ON position. In a manner described below, the AFC system responds to subsequent tuning errors by varying the nominal tuning voltage within a range of voltage that will be referred to as the AFC error correction range.

In conventional varactor tuners, the operating frequency of the local oscillator is determined by a variable tuning voltage applied to a voltage-dependent capacitance, i.e., a varactor diode, in the oscillator tank circuit. Increasing the voltage applied to the varactor reduces its capacitance and increases the oscillator's operating frequency. With regard to operation on a VHF channel, in order to cover both the Low Band (channels 2 through 6) oscillator frequency range of 101 to 129 MHz and the High Band (channels 7 through 13) range of 221 to 257 MHz with the same varactor diode, it is necessary to change the value of some other reactive element in the oscillator tank circuit. This is due to the limitations of maximum tuning voltage that can be applied and capacitance change ratio of commercially available diodes. This is typically done by electronically bypassing a portion of the inductance of the oscillator tank circuit. In the particular embodiment described here, a bandswitch voltage of +24 volts is applied to the VHF tuner when a High Band channel is selected. The bandswitch voltage turns on a diode tapped to a portion of the oscillator tank coil, thereby reducing its inductance. The reduction in inductance allows both the Low and High Band frequencies to be covered by applying approximately the same range of tuning voltages to the varactor diode. In the Low Band mode, a tuning voltage of, for example, from 2 to 18 volts is sufficient to vary the VHF local oscillator frequency from 101 to 129 MHz; in the High Band mode the range of tuning voltage from approximately 8 to 20 volts varies the VHF local oscillator frequency from 221 to 257 MHz. Similarly a tuning voltage of approximately 2 to 24 volts varies the UHF local oscillator frequency from 517 to 931 MHz. Because the relative range of frequencies covered by the UHF local oscillator is less than the range of frequencies covered by the VHF local oscillator (101 MHz to 257 MHz), bandswitching arrangements are not generally required for UHF tuners.

As is well known, AFC systems operate to correct errors in the local oscillator frequency for both the UHF and VHF tuners. For example, if the local oscillator is operating below the desired frequency, the corresponding picture carrier will be converted to a frequency less than 45.75 MHz. The AFC discriminator will provide an output of negative polarity and the error amplifier will operate to increase the tuning voltage, thereby increasing the local oscillator's operating frequency and substantially reducing the frequency error of the converted IF picture carrier.

An obviously important feature of any AFC system is its pull-in range, that is, the magnitude of tuning error for which the AFC circuit will provide an acceptable degree of correction. In particular, pull-in range may be defined as the range of tuning errors for which the AFC system can correct to within ±100 KHz. For example, the channel 2 picture carrier is located at 55.25 MHz and the nominal local oscillator frequency is 101 MHz. If the local oscillator is incorrectly tuned to 99.5 MHz, the picture carrier will be converted to 44.25 MHz, 1.5 MHz low. If the AFC correction voltage is able to reduce this tuning error so that the picture carrier is converted to 45.65 MHz, 100 KHz low, it is said to have a pull-in range of 1.5 MHz.

In some respects it is desirable to have as large a pull-in range as possible. However, in some cases an excessive pull-in range can be troublesome. For example, if the local oscillator is tuned below the desired frequency in the presence of a sufficiently strong lower adjacent channel, the adjacent sound carrier, normally converted to 47.25 MHz, may be converted to a frequency within the IF amplifier passband. In such situations an AFC system with an appropriately large pull-in range may spuriously lock onto the adjacent sound carrier. Analogously, if the local oscillator is tuned high, the desired channel sound carrier, normally at 41.25 MHz, may be converted to a frequency near 45.75 MHz. In this situation the AFC system may spuriously lock onto the sound carrier. Accordingly, in designing an AFC system, care must be taken to establish a pull-in range that prevents such adverse effects. Obviously, once the desired pull-in range has been determined, it should be maintained with respect to all channels, UHF or VHF, High or Low Band VHF.

However, with regard to varactor tuners, it has been found particularly difficult to maintain a constant AFC pull-in range from channel to channel. This is due largely to the non-linear voltage-to-capacitance relationship of varactor diodes. This effect is compounded by the relatively wide range of frequencies over which the diodes must be tuned. As a result, the tuning voltage sensitivity, that is, the change in tuning voltage required to effect a given deviation in local oscillator frequency, varies as a function of the oscillator's operating frequency. In general, in a given band greater changes in tuning voltage are required to effect a given deviation of higher local oscillator frequencies. As a result, AFC systems that provide a fixed range of tuning correction voltage for all channels tend to manifest a reduced pull-in range in the higher channels. That is, the pull-in range will be less on channel 6 than on channel 2, less on channel 13 than on channel 7, and less on channel 83 than on channel 14.

The scheme disclosed in Siwko, referred to above, and incorporated into the instant invention compensates for this effect. Disregarding for the moment the effect of transistor 41 and resistor 42, the circuit operates as follows. When the desired picture carrier is converted to a frequency below 45.75 MHz transistor 20 will be cut off and the voltage at the tuning control terminal of the VHF amplifier will be equal to $V_T$. When the desired picture carrier is converted to a frequency above 45.75 MHz, transistor 20 will be saturated and the voltage at the tuning control terminal will be $$\frac{V_T \times R37}{(R35 + R36 + R37)}.$$

The range of AFC error correction voltage is the difference between these two voltages and is equal to $$\frac{V_T \times (R35 + R36)}{(R35 + R36 + R37)}.$$

The significant feature of this circuit is that the range of error correction voltage has been made proportional to the tuning voltage and, for the resistance values shown in FIGS. 1A and 1B, equal to approximately 12.5% of $V_T$. Because the AFC pull-in range on a given channel is a function of the range of error correction voltage available, the circuit operates to maintain a relatively constant pull-in range from low to high channels, in spite of channel-to-channel variations in tuning voltage sensitivity.

However, in addition to varying from low to high channels, it has been found that the tuning voltage sensitivity varies from High to Low Band VHF. In general, the tuning voltage sensitivity is greater (less change in tuning voltage for a given change in frequency) on High Band. This results, at least in part, from the fact that the varactor is required to cover a lesser percentage range of frequencies on High Band than on Low Band. The percentage range on High Band is $$\frac{2(257 \text{ MHz} - 221 \text{ MHz})}{[(257 \text{ MHz}) + (221 \text{ Hz})]} \times 100\% \text{ or } 15\%.$$

Conversely, the percentage range on Low Band is $$\frac{2(129 \text{ MHz} - 101 \text{ MHz})}{[(129 \text{ MHz} + 101 \text{ MHz})]} \times 100\% \text{ or } 24\%.$$

Moreover, a change of capacitance in a tank circuit (using the same tuning capacitance) resonant at 240 MHz will cause a greater change in resonant frequency than will the same change of capacitance in a tank circuit resonant at 120 MHz. Consequently, a given change in tuning voltage will tend to cause a greater change in operating frequency on a High Band channel than on a Low Band channel. This is true even on High and Low Band channels having approximately the same nominal tuning voltage, that is, on channels where the varactor diode is operating over approximately the same portion of its capacitance-to-voltage characteristic.

For example, on a particular type of varactor VHF tuner the appropriate tuning voltage for operation on the Low Band channel 5 (local oscillator at 123 MHz) was approximately 11.25 volts. The tuning voltage for operation on the High Band channel 9 (local oscillator at 233 MHz) was 10.6 volts. Although the absolute tuning voltages for the two channels were comparable, it was found that increasing the tuning voltage approximately 300 millivolts on channel 5 would result in a local oscillator frequency increase of 500 Kilohertz (KHz); however, on channel 9, an identical ±500 KHz deviation in local oscillator frequency required only ±120 millivolts change in tuning voltage. Differences of this magnitude of tuning voltage sensitivity give rise to undesirable variations in AFC pull-in range. Such undesirable variations are circumvented by a gain switch means 40, comprising an NPN transistor 41, resistors R42 and R43, and a diode 44. Transistor 41 has a collector connected to a source of tuning voltage at the emitter of transistor 32, and an emitter series-connected through a resistance, R42, to the tuning control terminal of the VHF tuner. The base of transistor 41 is coupled through the series-connected resistor, R43, and diode 44 to a source of VHF bandswitch voltage. When a Low Band VHF channel is selected the VHF bandswitch voltage is at approximately 0 volts and transistor 41 is cut off. The range of AFC error correction voltage is as described above and is approximately equal to 12.5% of $V_T$. When a High Band channel is selected the VHF bandswitch voltage is approximately 24 volts and transistor 41 is effectively driven into saturation. Neglecting the relatively low saturation impedance of transistor 41, the total series resistance between the emitter of transistor 32 and the tuning control terminal of the VHF tuner is then $$\frac{(R35 + R36)(R42)}{(R35 + R36 + R42)}.$$

For the values shown in FIG. 1, this resistance is approximately 1.8K. According to the analysis above, the range of AFC error correction voltage is $$\left(\frac{1.8K}{1.8K + R37}\right)V_T$$

or approximately 3.5% of $V_T$. By way of comparison, in a prior art system having a channel 10 tuing voltage of 12.0 volts, the AFC circuitry would operate to provide a tuning voltage of 10.5 volts when the desired picture carrier is converted to a frequency below 45.75 MHz and a tuning voltage of 12 volts when the picture carrier is converted above 45.75 MHz. The range of AFC error correction voltage is then 1.5 volts. In a system incorporating the instant invention the corresponding correction voltages are 11.58 volts and 12 volts respectively and the range of AFC error correction voltage is 0.42.

An alternate embodiment of gain switch means 40 is also shown in FIG. 1B. In the alternate embodiment gain switch means 40 comprises a PNP transistor 45 having an emitter electrode connected to the emitter of transistor 32 and a collector electrode connected to R42. The base electrode of transistor 45 is coupled through resistor 43 to the collector of transistor 46. Transistor 46 has an emitter electrode connected to circuit ground and a base electrode coupled through a resistor R47 to the source of VHF Bandswitch voltage. Operation is similar to what has been previously described. During operation on a Low Band VHF channel, transistor 40 will be non-conducting and there will be no path for base current for transistor 45 and it will be cut off. During operation on a High Band VHF channel, transistor 47 will be turned on, thereby providing base current for transistor 45 and driving it into saturation. As above, the range of AFC error correction voltage will be $$\left(\frac{1.8K}{1.8 + R37}\right)V_T$$

or approximately 3.5% of $V_T$. In either embodiment, effect of gain switch means 40 is to limit the range of AFC error correction voltage, thereby limiting the AFC pull-in range and providing protection against false locking on carrier signals other than the desired channel picture carrier.

Similar difficulties are encountered in attempting to effect a relatively constant AFC pull-in range on UHF channels. The tuning voltage sensitivity of UHF tuners tends to be substantially constant up to a tuning voltage of approximately 15 volts (corresponding to channel 60) and tends to decrease with increasing tuning voltage. These difficulties are largely overcome by a tuning voltage sensing circuit 50 comprising a first resistor R51 connected to source of potential voltage UHF B+, a second resistor R52 connected between R51 and circuit ground, and a diode 53 connected between the junction of R51 and R52 and the common terminal of the AFC mode selection switch. As shown in FIGS. 1A and 1B, tuning voltage sensing circuit is also connected through the effective combined series resistance of R36 and R37 to the UHF tuning control terminal.

In the absence of tuning voltage sensing circuit, the AFC error amplifier operates to provide a range of AFC correction voltage linearly proportional to $V_T$. The magnitude of this range is equal to $$V_T \times \frac{R35}{R35 + R36 + R37}.$$

Although this scheme is effective in compensating for the non-linear capacitance-to-voltage characteristics of varactor diodes used in UHF tuners, it nevertheless has been found that AFC pull-in range on a mid-band UHF channel, such as channel 60, tends to be significantly greater than that on low UHF channels. As pointed out above, this is particularly troublesome when the local oscillator tuning error is such that the lower adjacent channel sound carrier, normally at 47.25 MHz, is converted to a frequency approaching 45.75 MHz. In such situations an AFC system with a sufficiently large pull-in range will have a tendency to falsely lock onto the lower adjacent sound carrier. A particular type of UHF tuner used in conjunction with the prior art AFC circuit, exhibited a 3 MHz pull-in range local oscillator tuned low) on a mid UHF channel and a 1 MHz pull-in range on a low UHF channel. A 3 MHz pull-in range is in most instances excessive in that it renders the AFC system especially susceptible to false locking. Threshold detecting means 50 operates to reduce the variations of AFC pull-in range from low through the mid UHF channels.

Figure 2:
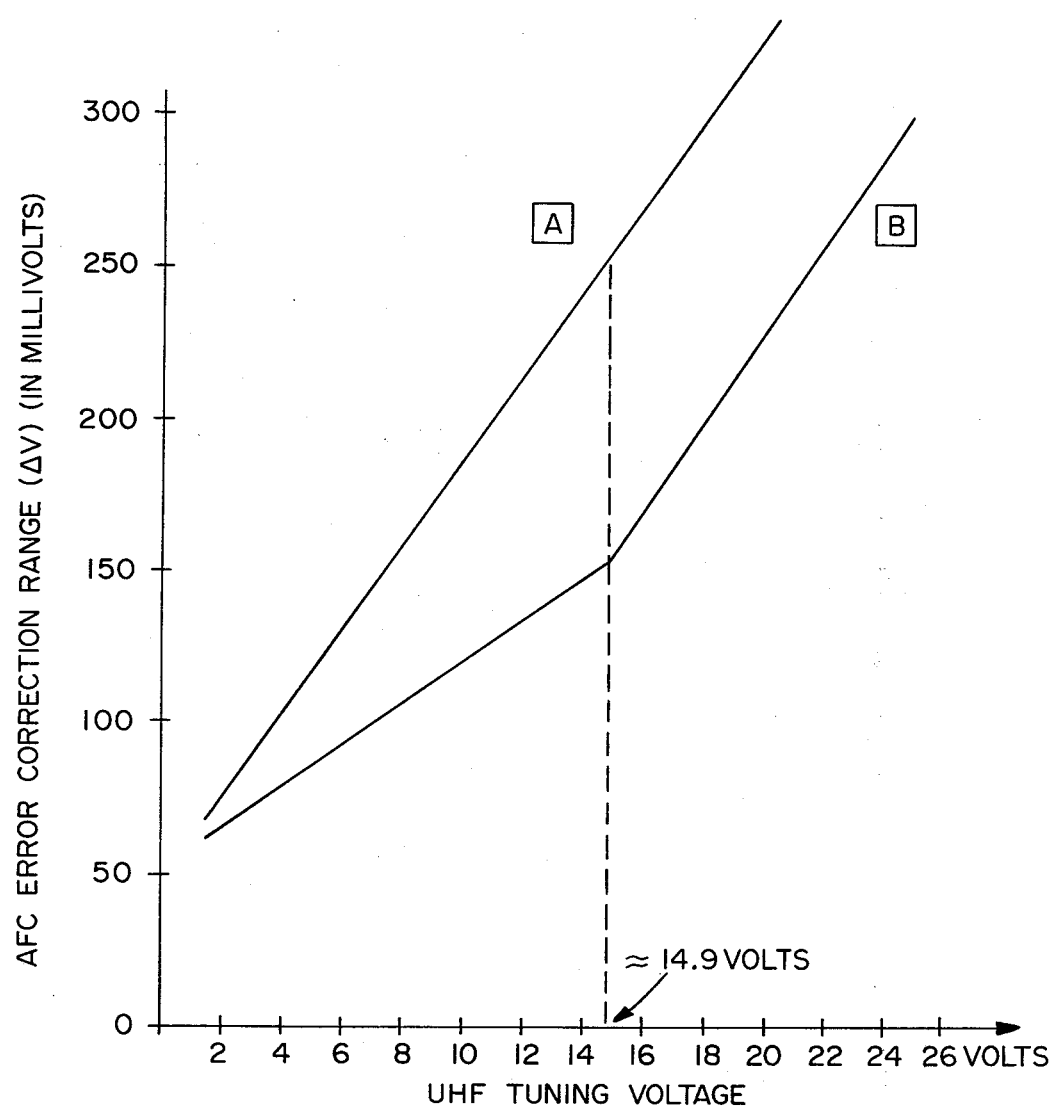
FIG. 2 is a graphical representation of the manner in which the AFC error correction voltage assumes varying proportions of the tuning voltages depending on whether the tuning voltage is above or below a predetermined value.

In the specific embodiment presently described, UHF B+ is a potential of 24 volts D.C. whenever a UHF channel is selected. During operation on a VHF channel, UHF B+ is effectively open-circuited and sensing circuit 50 has no effect on the operation of the AFC circuitry. The effect of sensing circuit 50 on the operation of the UHF AFC is shown in FIG. 2. Line A represents the error-correction-range versus tuning voltage characteristic of the prior art AFC circuitry disclosed in Siwko. Note that the error correction range is a strictly linear function of the tuning voltage. If a desired amount of error correction, say 65–70 millivolts, is developed at a tuning voltage of 2 volts, then approximately 250 millivolts will be developed at 14.9 volts. This is an amount that will likely cause the false-locking phenomena mentioned above.

The line labeled B represents the effect of the sensing circuit. Note that line B has a piecewise-linear characteristic with a breakpoint that will be shown to occur at a value slightly below $$(UHF\ B+) \times \frac{R52}{R52 + R51}.$$

For values of R51 and R52 equal to 240 Kilohms (K) and 430K respectively, the breakpoint occurs at approximately 14.9 volts, the voltage required to tune channel 60. Approximately the same amount of error correction voltage is developed at 2 volts tuning voltage. However, the reduced slope below the initial, lower region of the characteristic results in only 150 millivolts of error correction voltage at 14.9 volts, thereby avoiding false locking phenomena. Above the breakpoint, at 14.9 volts the slope of line B is approximately equal to that of line A, thereby providing, as desired, a higher proportional range of error correction voltage at higher tuning voltages.

Figure 3A:
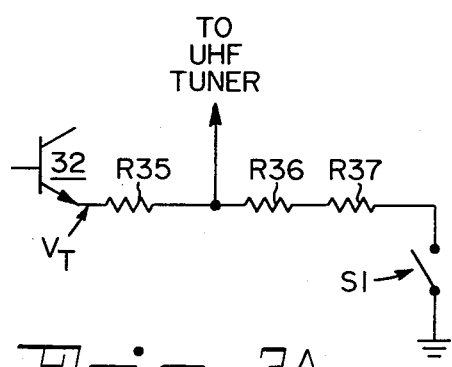
FIGS. 3A and 3B illustrate equivalent circuits facilitating an appreciation of the manner in which the effect of FIG. 2 is accomplished.
Figure 3B:
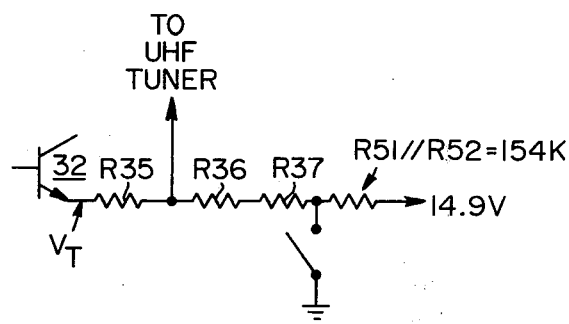

Operation may be understood with the aid of the equivalent circuits shown in FIGS. 3A and 3B. The voltage division established by R51 and R52 results in approximately 15.4 volts on the anode of diode 53. For tuning voltages above 14.9 volts the diode is non-conducting and the AFC circuit reduces to the equivalent circuit of FIG. 3A. For tuning voltages below 14.9 volts, the diode is conducting and the AFC circuit reduces to the equivalent circuit of FIG. 3B. For simplicity the operation of the AFC amplifier is represented by a switch S1. S1 can be considered when the IF picture carrier is converted to a frequency above 45.75 MHz and closed when it is converted to a frequency below 45.75 MHz.

As shown in FIG. 3A, when the tuning voltage, $V_T$, at the emitter of transistor 32 is above 14.9 volts, $V_T$ is coupled through R35 to the UHF tuning control terminal and through R36 and R37 to S1. When S1 is open, that is, IF video carrier below 45.75 MHz, the voltage at the UHF tuning control terminal, $U_{max}$, is equal to $V_T$. When S1 is closed the voltage at the UHF tuning control terminal, $U_{min}$, is $$\frac{R36 + R37}{R35 + R36 + R37} \times V_T$$

or, for the values shown in FIG. 1, 0.97373 $V_T$. The range of error correction voltages, $\Delta V$, is equal to $U_{max}-U_{min}$ or 0.0262697 $V_T$.

However, as shown in FIG. 3B, when the tuning voltage is less than 14.9 volts, $V_T$ is coupled through R35 to the UHF tuning control terminal, through R36 and R37 to S1, and through an approximate 154K resistor to an equivalent voltage of 14.9 volts. The 154K resistor is the parallel equivalent of R51 and R52. An analysis similar to the one above indicated that in the configuration $U_{max}$ is equal to 0.99289 $V_T$ + 0.10587 and $U_{min}$ is equal to 0.97373 $V_T$. Accordingly, $\Delta V$ is equal to 0.10587 volts + 0.19164 $V_T$. The above equations for $\Delta V$ combine to create the piecewise-linear characteristic of line B in FIG. 2. Above a breakpoint approximately corresponding to the voltage required to tune channel 60, the $\Delta V$ versus Tuning Voltage characteristic has a greater slope than below the breakpoint. In the manner described above, the location of the breakpoint is determined by the ratio of R51 and R52 and the difference in slopes is determined by the absolute values of R51 and R52. The piecewise linear characteristic effectively compensates for the UHF varactor tuner frequency-voltage characteristics and provides substantially constant AFC pull-in range across the entire band of UHF channels.

Although in the instant embodiment the breakpoint was chosen to occur at a tuning voltage corresponding to channel 60, by appropriately choosing the values of R51 and R52 the breakpoint can be made to occur at a different tuning voltage and the slopes of the characteristic can be made to provide different amounts of compensation. In addition, schemes employing more than one breakpoint are easily accomplished.

Accordingly, while there has been shown and described what at present is considered to be the preferred embodiment of the invention, it will be obvious to those skilled in the art that various changes and modifications may be made therein without departing from the scope of the invention as defined by the appended claims.

Furthermore, although the tuning sensing circuit, as described above, was operational only for UHF channels, by connecting R51 to a source of potential that is available at all times, a similar piecewise linear characteristic could be provided, as desired, for both UHF and VHF channels.

What is claimed is:

1. In a television receiver having a radio frequency tuner including a UHF tuner and a VHF tuner, said tuners having respective UHF and VHF tuning control terminals for the application of respective tuning voltages for establishing the frequency of operation of said tuners, said receiver further including a source of tuning voltage coupled to said UHF tuning control terminal through a series-connected first resistance and to said VHF tuning control terminal through a series-connected second resistance and an automatic frequency control system for effecting an error-corrected voltage at said tuning control terminals so as to compensate for errors in the frequency of operation of said tuners, an adaptive wideband AFC circuit comprising a gain switch means for varying the range of said error-corrected voltage which is applied to at least a selected one of said tuning control terminals, said gain switch means operating in response to a signal indicative of operation on a channel included in a predetermined band of channels.

2. An adaptive wideband AFC circuit as defined in claim 1 above wherein said gain switch means comprises:
   a first electrode connected to said source of tuning voltage;
   a second electrode connected to said selected one of said tuning control terminals; and
   a third electrode connected to a source of signals indicative of operation on said predetermined band of channels.

3. Adaptive wideband AFC circuit as defined in claim 2 above wherein said gain switch means further comprises a series-connected transistor and resistor.

4. Adaptive wideband AFC circuit as defined in claim 3 above wherein said transistor is driven into a first state of conduction in response to a signal indicative of operation.

5. An adaptive wideband AFC circuit as defined in claim 4 above wherein said series-connected transistor and resistor alter the effective series resistance between said source of tuning voltage and said selected tuning control terminal in response to said signal indicative of operation on one of a said predetermined band of channels.

6. An adaptive wideband AFC circuit as defined in claim 5 above wherein said transistor is driven into saturation in response to a VHF Bandswitch signal.

7. An adaptive wideband AFC circuit as defined in claim 1 above wherein the range of said error correction voltage applied to said tuning control terminals is a predetermined proportion of said tuning voltage and wherein said gain switch means comprises a series-connected transistor and resistor, said transistor comprising an electrode coupled to a VHF bandswitch signal so that said predetermined proportion is of one value during operation on a Low Band VHF channel and of a substantially different value during operation on a High Band VHF channel.

8. An adaptive wideband AFC circuit as defined in claim 7 above further comprising a tuning voltage sensing circuit for effecting a range of error correction voltage at said UHF tuning control terminal of a first proportion for tuning voltages below a predetermined value and of a second proportion for tuning voltages above said predetermined value.

9. In a television receiver having a radio frequency tuner including a UHF tuner and a VHF tuner, said tuners having respective UHF and VHF tuning control terminals for the application of respective tuning voltages for establishing the frequency of operation of said tuners, said receiver further including a source of tuning voltage coupled to said UHF tuning control terminal through a series-connected first resistance and to said VHF terminal through a series-connected second resistance and an automatic frequency control system for effecting an error-corrected voltage at said tuning control terminals so as to compensate for errors in the frequency of operation of said tuners, an adaptive wideband AFC circuit comprising a tuning voltage sensing circuit for effecting a varying range of error-corrected voltage at at least one of said tuning control terminals, said range being a first proportion of tuning voltages from said source below said predetermined value and a second proportion of tuning voltages from said source above said predetermined value.

10. An adaptive wideband AFC circuit as defined in claim 9 wherein said tuning voltage sensing circuit comprises a voltage divider connected to a source of potential voltage and a diode connected between said voltage divider and an output of said AFC system.

11. An adaptive wideband AFC system as defined in claim 10 wherein said voltage divider establishes a voltage on one end of said diode and wherein the other end of said diode is coupled to said source of tuning voltage so that said diode is in a first state of conduction for tuning voltages below said predetermined value and in a second state of conduction for tuning voltages above said predetermined value.

12. An adaptive wideband AFC system as defined in claim 10 wherein said voltage diodes comprises a first resistor and a second resistor, the ratio of whose values determine said predetermined value and the magnitudes of whose values determine said first porportion and said second proportion of said tuning voltages.

13. An adaptive wideband AFC circuit as defined in claim 9 further comprising a gain switch means for varying the range of said error correction voltage which is applied to at least one of said tuning control terminals, said gain switch means comprising:
a first electrode connected to said source of tuning voltage,
a second electrode connected to at least one of said tuning control terminals; and
a third electrode connected to a source of signals indicative of operation on a predetermined band of channels.

14. An adaptive wideband AFC circuit as defined in claim 13 wherein said gain switch means comprises a series-connected transistor and resistor connected between said source of tuning voltage and said selected one of said tuning control terminals, said transistor and resistor for varying the effective resistance between said source of tuning voltage and said selected one of said tuning control terminals.

15. An adaptive wideband AFC system as defined in claim 14 wherein said voltage divider is connected to a source of UHF tuner energizing voltage so that said tuning sensing circuit effects a varying range of error correction voltage at the UHF tuning control terminal.

16. An adaptive wideband AFC system as defined in claim 15 wherein the second electrode of the gain switch means is connected to the VHF tuning control terminal and the third electrode is connected to a source of VHF Bandswitch voltage so that the range of error correction voltage applied to the VHF tuning control terminal is a first proportion of the tuning voltage during operation on Low Band VHF channels and second proportion of the tuning voltage during operation on High Band VHF channels.

* * * * *